United States Patent [19]
Dubner

[11] Patent Number: 4,870,479
[45] Date of Patent: Sep. 26, 1989

[54] VIDEO GRAPHICS MEMORY STORAGE REDUCTION TECHNIQUE

[75] Inventor: Robert J. Dubner, Westwood, N.J.

[73] Assignee: Dubner Computer Systems, Inc., Paramus, N.J.

[21] Appl. No.: 188,945

[22] Filed: May 2, 1988

[51] Int. Cl.$^4$ .................... H04N 11/04; H04N 7/13
[52] U.S. Cl. .................................. 358/13; 358/21 R; 358/133
[58] Field of Search .................. 358/13, 21 R, 133

[56] References Cited

U.S. PATENT DOCUMENTS

| | | | |
|---|---|---|---|
| 3,860,953 | 1/1975 | Cutler et al. | 358/13 |
| 4,125,856 | 11/1978 | Netravali et al. | 358/13 |
| 4,479,142 | 10/1984 | Buschman et al. | 358/13 |
| 4,541,008 | 9/1985 | Fishman et al. | 358/13 |
| 4,731,646 | 3/1988 | Kliem | 358/13 |

*Primary Examiner*—John W. Shepperd
*Attorney, Agent, or Firm*—Francis I. Gray

[57] ABSTRACT

A video graphics memory storage reduction technique combines a frame buffer memory system with a run length encoded memory system by providing a luminance/chrominance decoder/multiplexer to convert output digital data segments from a memory into color components in lieu of using a color look up table. The digital data segments also are input to a detector and a switch, with the luminance portion being compared with a predetermined fixed value outside the valid luminance value range and the chrominance portion being passed through the switch in lieu of a constant when the luminance matches the detector value. A run length encoder logic circuit uses the output of the switch to generate access commands for the memory, and the detector causes the luminance/chrominance decoder to hold the last color until the next digital data segment is accessed by the logic circuit.

4 Claims, 2 Drawing Sheets

4,870,479

VIDEO GRAPHICS MEMORY STORAGE REDUCTION TECHNIQUE

BACKGROUND OF THE INVENTION

The present invention relates to digital memory reduction techniques, and more particularly to a video graphics memory storage reduction technique which combines run length encoding and a frame buffer into a single machine.

Bit-mapped frame buffers have been around for a relatively long time, culminating in the type of a display where one bit in memory corresponds to one pixel on a video screen. With enough pixels significant resolution of an image is attained. For example for an encoded video television system, such as NTSC, the resolution attained is 485 lines by 768 pixels per line, 768 being convenient because it is 1.5 times 512. An entire picture frame thus fits nicely within 48K bytes of memory, a byte being eight bits. For gray scale gradations, however, there are generally eight bits per pixel instead of one, requiring 384K bytes of memory and proportionally more processing power. A full color image in the video world requires three video components and a key signal, requiring eight bits for each channel, or 1.5 megabytes of memory.

Another method is to use a look up table (LUT). The LUT scheme uses the eight bit pixel to index into a 256 by four byte memory, so each of the 485 by 768 pixels may have any of 256 colors, each of which can be one of the four billion possible combinations of R, G, B and K. Of course either of these schemes may be arbitrarily simplified or complicated by changing the number of bits per pixel and/or the number of pixels.

With limited computer power and expensive memory a run length encoding scheme was developed. Each color change is stored as a two byte pair segment. There is a color index portion, a run length portion and a couple of control bits. Thus there is a color index into a color LUT which contains, for example, three bits for each of R, G and B with a count from the run length portion indicating for how many pixels that particular color remains the same.

What is desired is a memory reduction scheme that makes use of the advantages of both frame buffers and run length encoding.

SUMMARY OF THE INVENTION

Accordingly the present invention provides a video graphics memory storage reduction technique which combines a frame buffer and a run length encoding scheme. A data storage memory output data to a luminance/chrominance decoder or multiplexer which outputs the luminance and chrominance components corresponding to the data from the memory. The luminance component of the data is compared with a predetermined luminance value outside the legal luminance value range while the chrominance component is also input to a switch. When the luminance value equals the predetermined luminance value, the chrominance component is input to a run length logic circuit via the switch and is interpreted as a run length word, holding the previous color for the number of pixels specified by the run length word. If the luminance value does not equal the predetermined luminance value, a length of one is input to the run length logic circuit via the switch and the data from the memory is treated as a frame buffer pixel.

The objects, advantages and novel features of the present invention are apparent from the following detailed description when read in conjunction with the appended claims and attached drawing.

DESCRIPTION OF THE PREFERRED EMBODIMENT

Figure 1:
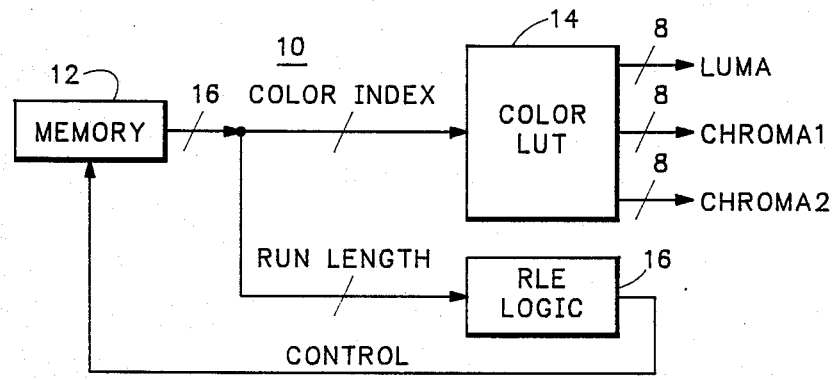
FIG. 1 is a block diagram of a conventional run length encoded memory system.
Figure 2:
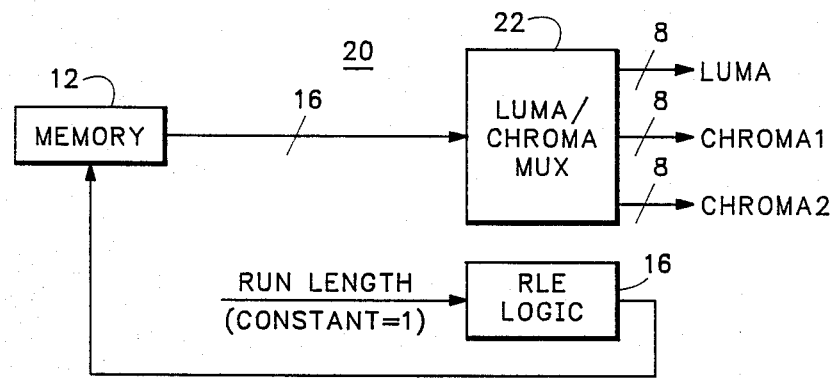
FIG. 2 is a block diagram of a frame buffer memory system formed from the run length encoded memory system of FIG. 1.
Figure 3:
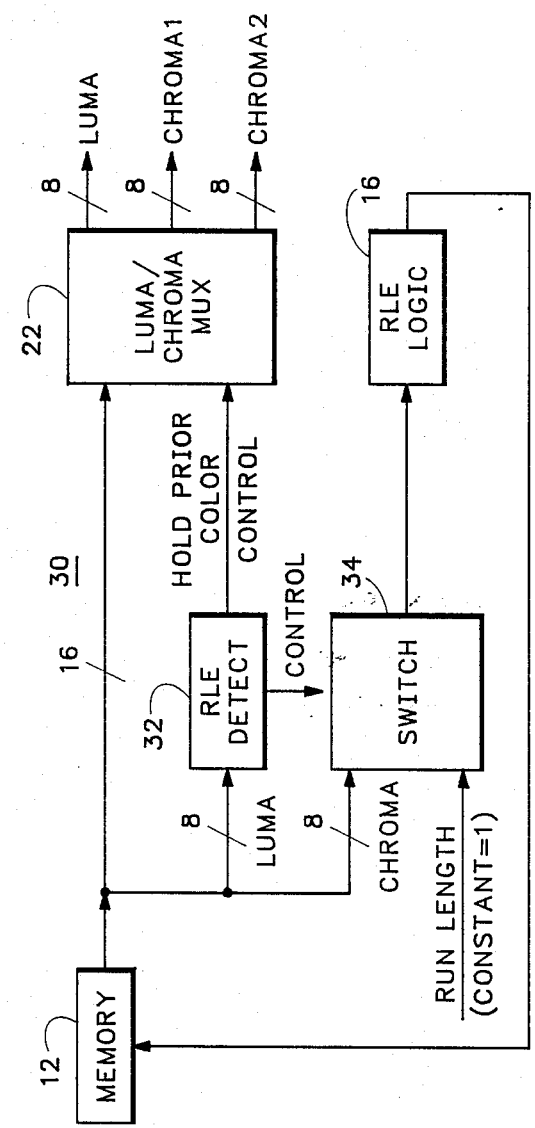
FIG. 3 is a block diagram of a combination frame buffer memory and run length encoded memory system according to the present invention.

Referring now to FIGS. 1 and 2 the conversion of a run length encoded memory system 10 to a frame buffer memory system 20 is illustrated. In the run length encoded system 10, as discussed previously, the video data is stored in a memory 12 in the form of a pair of bytes, or a sixteen bit segment. A portion of the segment is a color index into a color look up table (LUT) 14 from which the appropriate luminance and chrominance values LUMA, CHROMA1 and CHROMA2 are obtained. Another portion of the segment is a run length word which is input to a run length encoded (RLE) logic circuit 16. The output of the RLE logic circuit 16 is a control signal to the memory 12 which holds the memory address constant until the number of pixels indicated by the run length word have been output from the color LUT 14 before incrementing the memory address for the next data word. To convert this run length encoded system 10 to the frame buffer system 20 the color LUT 14 is bypassed and a luminance/chrominance decoder or multiplexer 22 is substituted. The data from the memory 12 is in the form of an eight bit luminance word followed by an eight bit chrominance word such that in a 4:2:2 format for every four luminance words, two words for each of the chrominance components are output. Instead of a portion of the segment being input to the RlE logic circuit 16 as the run length word, a constant run length word is input. Where the constant run length word has a value of one, the memory is accessed as an ordinary frame buffer. The constant run length word may be programmable to magnify the image represented by the video data from the memory 12.

In order to cause the frame buffer memory system 20 of FIG. 2 to combine the functions of both a frame buffer memory system and a run length encoded memory system, the data segment from the memory 12 also is input to respectively a RLE detector 32 and a switch 34, the luminance word of the segment being input to the RLE detector and the chrominance word of the segment being input to the switch. Since in a video digital standard valid values of luminance are limited to a range of 16 to 243, a predetermined illegal luminance value, such as 255, may be used to indicate that the current segment is a run length encoded segment as opposed to being a frame buffer segment. The output of the RLE detector 32 controls the switch 34 so that when the luminance portion of the segment equals the predetermined illegal luminance value, the switch outputs the chrominance portion of the segment to the RLE logic circuit 16 as the run length word, otherwise the constant run length word is output to the RLE logic circuit. Also output from the RLE detector 32 is a hold signal to the luminance/chrominance multiplexer 22 to cause the output of the multiplexer to continue to output the last color value until a new segment is read from the memory 12 after the number of pixels equal to the run length word has been output.

In operation a segment having a luminance portion within the valid range provides a color output from the luminance/chrominance multiplexer 22 and the run length word from the switch 34 is one so that at the next pixel time the next segment in memory 12 is addressed. If the next segment has a luminance portion equal to the predetermined illegal luminance value, then the output of the luminance/chrominance multiplexer 22 is held at the last color values LUMA, CHROMA1, CHROMA2 by a hold signal from the RLE detector 32 and the switch 34 selects the chrominance portion of the segment as the run length word for the RLE logic circuit 16. Thus for large backgrounds having a constant color three segments are all that is necessary, two segments to provide luminance and both chrominance components and one segment to provide the run length information.

Thus the present invention provides a video graphics storage memory reduction technique that combines both frame buffer and run length encoded systems into a single machine by using the luminance portion of a data segment from the memory as a run length encoded identifier so that the segments are frame buffer segments until a run length encoded segment is output, at which time the prior color is held for the period indicated by the chrominance portion of the segment.

What is claimed is:

1. A reduced storage memory system comprising:
   means for storing digital data segments representing a video image, each digital data segment having a first portion and a second portion;
   means for decoding the first portion and the second portion of each digital data segment to produce a color component output for display;
   means for detecting from the first portion when one of the digital data segments contains a run length word in the second portion; and
   means for controlling the storing means as a function of the run length word so that the decoding means holds a prior color component output for continuous display for a period determined by the run length word.

2. A system as recited in claim 1 wherein the detecting means comprises means for comparing the first portion with a predetermined fixed value such that when there is a match the run length word is detected after a period determined by the run length control signal.

3. A system as recited in claim 2 wherein the controlling means comprises:
   means for switching between a constant run length word and the run length word to output a run length control signal, the switching being a function of the output from the detecting means; and
   means for generating from the run length control signal access commands for the storing means to output a next digital data segment to the decoding and detecting means.

4. A system as recited in claim 2 wherein the first portion comprises a luminance word and the second portion comprises a chrominance word when the digital data segment represents color components of the video image, and the first portion comprises the predetermined fixed value and the second portion comprises the run length word when the digital data segment represents a period of time for the prior color component output to be held, the predetermined fixed value being selected from outside a range of valid values for the luminance word.

* * * * *